(12) United States Patent
Jiang et al.

(10) Patent No.: US 11,652,029 B2
(45) Date of Patent: May 16, 2023

(54) 3-D PACKAGE STRUCTURE FOR ISOLATED POWER MODULE AND THE METHOD THEREOF

(71) Applicant: Monolithic Power Systems, Inc., San Jose, CA (US)

(72) Inventors: Hunt Jiang, Saratoga, CA (US); Jian Jiang, Saratoga, CA (US); Di Han, San Jose, CA (US)

(73) Assignee: Monolithic Power Systems, Inc., San Jose, CA (US)

( * ) Notice: Subject to any disclaimer, the term of this patent is extended or adjusted under 35 U.S.C. 154(b) by 19 days.

(21) Appl. No.: 17/360,071

(22) Filed: Jun. 28, 2021

(65) Prior Publication Data

US 2022/0415759 A1    Dec. 29, 2022

(51) Int. Cl.
*H01L 23/495* (2006.01)
*H01L 27/06* (2006.01)
*H01L 25/065* (2023.01)

(52) U.S. Cl.
CPC .. *H01L 23/49503* (2013.01); *H01L 23/49541* (2013.01); *H01L 25/0657* (2013.01); *H01L 27/0688* (2013.01); *H01L 2225/06558* (2013.01)

(58) Field of Classification Search
CPC ......... H01L 23/49541; H01L 23/49531; H01L 23/495; H01L 25/0657; H01L 27/0688
USPC ........................................ 257/686, 784, 676
See application file for complete search history.

(56) References Cited

U.S. PATENT DOCUMENTS

| 8,461,669 | B2 | 6/2013 | Yang et al. |
| 8,604,597 | B2 | 12/2013 | Jiang |
| 8,823,185 | B2 * | 9/2014 | O ...................... H01L 23/49575 |
| | | | 257/784 |
| 10,396,037 | B2 * | 8/2019 | Hwang ................. H01L 23/552 |
| 10,978,410 | B2 * | 4/2021 | Liu ................... H01L 23/49838 |
| 11,102,886 | B2 * | 8/2021 | Sung ...................... H05K 1/165 |
| 2020/0326399 | A1 * | 10/2020 | Yoshida ............. G01R 33/0206 |

OTHER PUBLICATIONS

U.S. Appl. No. 12/419,212, filed Apr. 6, 2009, Monolithic Power Systems.
U.S. Appl. No. 13/016,661, filed Jan. 28, 2011, Monolithic Power Systems.
U.S. Appl. No. 17/154,519, filed Jan. 21, 2021, Monolithic Power Systems.
U.S. Appl. No. 17/197,394, filed Mar. 10, 2021, Monolithic Power Systems.

* cited by examiner

*Primary Examiner* — Jami Valentine Miller
*Assistant Examiner* — Dilinh P Nguyen
(74) *Attorney, Agent, or Firm* — Perkins Coie LLP

(57) ABSTRACT

A 3-D package structure for isolated power module is discussed. The package structure has metal trace in a support layer (e.g. a substrate board), which is covered by two magnetic films from both sides, thus an effective transformer is formed. An IC die which contains a voltage regulator is stacked above the support layer, which significantly reduces the package size.

15 Claims, 2 Drawing Sheets

3-D PACKAGE STRUCTURE FOR ISOLATED POWER MODULE AND THE METHOD THEREOF

FIELD

The present invention relates to semiconductor packages, and more particularly relates to isolated power module package structures.

BACKGROUND

Isolated power module packages comprise a transformer, an IC die, capacitors and other components. The IC die which contains a voltage regulator is typically placed side by side with the transformer on a printed circuit board, which enlarges the package size. In addition, air cored transformers without magnets are adopted, which is weak in power rating and EMI performance.

Thus, efforts are needed in the field to provide a better package structure.

SUMMARY

It is an object of the present invention to provide an improved package structure, which solves the above problems.

In accomplishing the above and other objects, there has been provided, in accordance with an embodiment of the present invention, a 3-D package structure, comprising: a support layer, configured to contain metal traces; a first magnetic layer, attached to a first surface of the support layer; an up board, stacked on the support layer; a second magnetic layer, attached between a second surface of the support layer and the up board, the first surface and the second surface of the support layer being opposite to each other; and an IC die, stacked on the up board, the IC die being configured to contain a voltage regulator.

In addition, there has been provided, in accordance with an embodiment of the present invention, a 3-D package structure, comprising: a support layer, configured to contain metal traces; a first magnetic layer and a second magnetic layer, attached respectively on a first surface and a second surface of the support layer, the first surface and the second surface are opposite to each other; and an IC die, assembled above the first magnetic layer, the IC die being configured to contain a voltage regulator.

Furthermore, there has been provided, in accordance with an embodiment of the present invention, 3-D packaging method, comprising: attaching a first magnetic layer to a first surface of a support layer, the support layer containing metal traces; attaching a second magnetic layer between a second surface of the support layer and an up board, the up board being stacked above the support layer, and the first surface and the second surface of the support layer are opposite to each other; stacking an IC die on the up board, the IC die being configured to contain a voltage regulator; and assembling other passive components on the up board.

The use of the similar reference label in different drawings indicates the same of like components.

DETAILED DESCRIPTION

Embodiments of circuits for a 3-D package structure are described in detail herein. In the following description, some specific details, such as example circuits for these circuit components, are included to provide a thorough understanding of embodiments of the invention. One skilled in relevant art will recognize, however, that the invention can be practiced without one or more specific details, or with other methods, components, materials, etc.

The following embodiments and aspects are illustrated in conjunction with circuits and methods that are meant to be exemplary and illustrative. In various embodiments, the above problem has been reduced or eliminated, while other embodiments are directed to other improvements.

Figure 1:
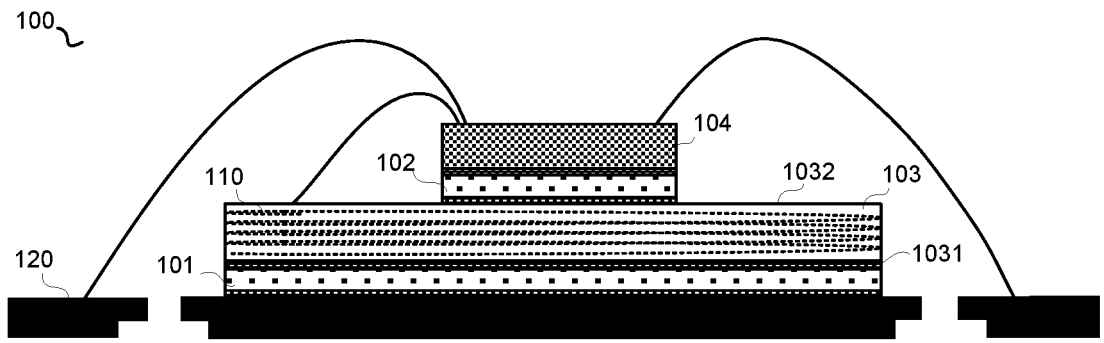
FIG. 1 schematically shows a 3-D packaging structure 100 in accordance with an embodiment of the present invention.

FIG. 1 schematically shows a 3-D package structure 100 in accordance with an embodiment of the present invention. In the example of FIG. 1, the 3-D package structure 100 comprises: a support layer 103, configured to contain metal traces 110 (e.g. copper traces, shown as dashed line); a first magnetic layer 101 and a second magnetic layer 102, attached respectively on a first surface 1031 and a second surface 1032 of the support layer 103; and an IC die 104, assembled above the first magnetic layer 101, the IC die 104 being configured to contain a voltage regulator. The first surface 1031 and the second surface 1032 are opposite to each other.

One skilled in the art should realize that the so-called 3-D in the present invention refers to three dimensions, i.e., x, y, and z directions.

In one embodiment of the present invention, the first magnetic layer 101 and the second magnetic layer 102 may be respectively attached to the support layer 103 by way of an adhesive layer.

In another embodiment of the present invention, the first magnetic layer 101 and the second magnetic layer 102 may be embedded into the support layer 103.

In one embodiment of the present invention, the package structure 100 may be assembled at a lead frame 120, e.g., the support layer 103 and the IC die 104 may be coupled to the lead frame by bonding wires.

In one embodiment of the present invention, the support layer 103 may comprise a substrate board, and the metal traces may be embedded in the substrate board.

In one embodiment of the present invention, the support layer 103 includes multiple layers, e.g., the support layer 103 may comprise a multilayer substrate.

Figure 2:
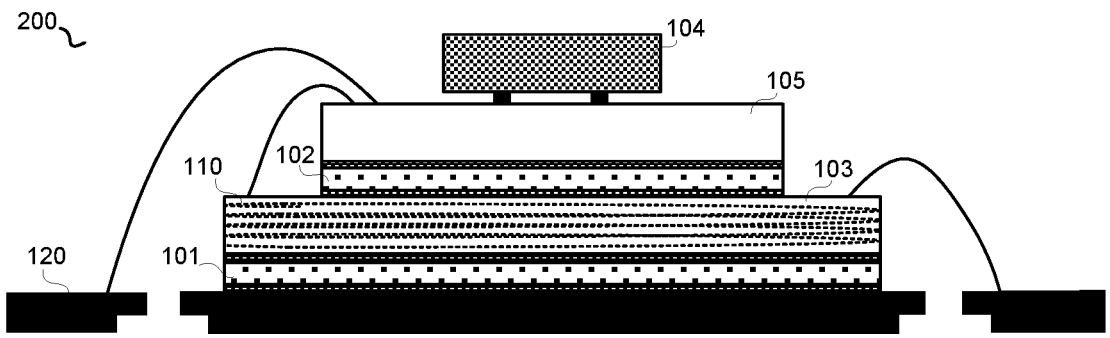
FIG. 2 schematically shows a 3-D packaging structure 200 in accordance with an embodiment of the present invention.

FIG. 2 schematically shows a 3-D package structure 200 in accordance with an embodiment of the present invention. In the example of FIG. 2, the 3-D package structure 200 comprises: a support layer 103, configured to contain metal traces 110; a first magnetic layer 101, attached to a first surface of the support layer 103; an up board 105, stacked on the support layer 103; a second magnetic layer 102, attached between a second surface of the support layer 103 and the up board 105; and an IC die 104, stacked on the up board 105, the IC die 104 being configured to contain a voltage regulator. The first surface and the second surface of the support layer 103 are opposite to each other.

In one embodiment of the present invention, the up board 105 includes multiple layers, e.g., the up board 105 may comprise a multilayer substrate.

In one embodiment of the present invention, the IC die 104 may comprise a flip chip, electrically coupled to the up board 105 by way of contacts (e.g., metal contacts, or contact bumps).

In one embodiment of the present invention, the support layer 103 may comprise a substrate board, and the metal traces may be embedded in the substrate board.

In the example of FIG. 2, the up board 105 is electrically coupled to the support layer 103 and the lead frame 120 by bonding wires.

In one embodiment of the present invention, the IC die 104 may comprise other package types. It may have ball grid array (BGA), or land grid array (LGA), or quad flat no-leads package (QFN), or chip scale package (CSP).

Figure 3:
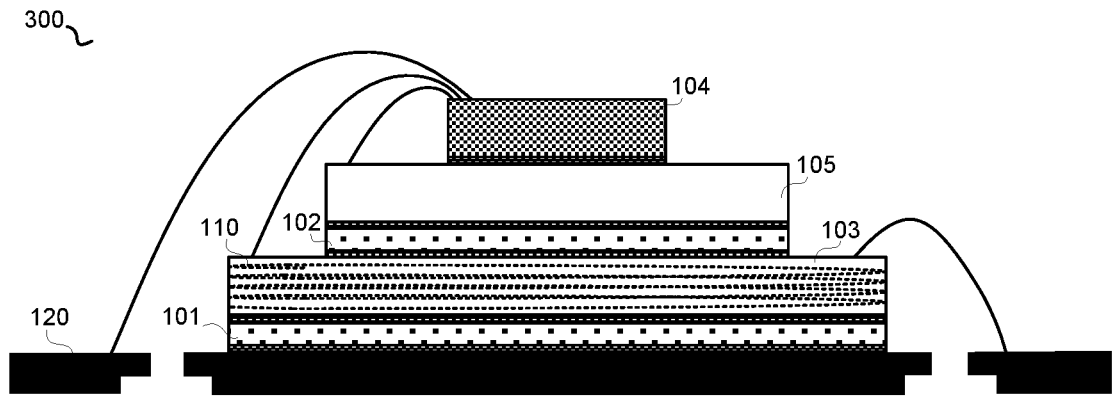
FIG. 3 schematically shows a 3-D packaging structure 300 in accordance with an embodiment of the present invention.

FIG. 3 schematically shows a 3-D package structure 300 in accordance with an embodiment of the present invention. In the example of FIG. 3, the 3-D package structure 300 is similar to the 3-D package structure 200 in FIG. 2, with a difference that the IC die 104 in the 3-D package structure 300 is coupled to the up board 105, the support layer 103 and the lead frame 120 by way of bonding wires.

In the embodiments of FIG. 2 and FIG. 3, other passive components (e.g. capacitors) may be assembled on the up board 105.

Figure 4:
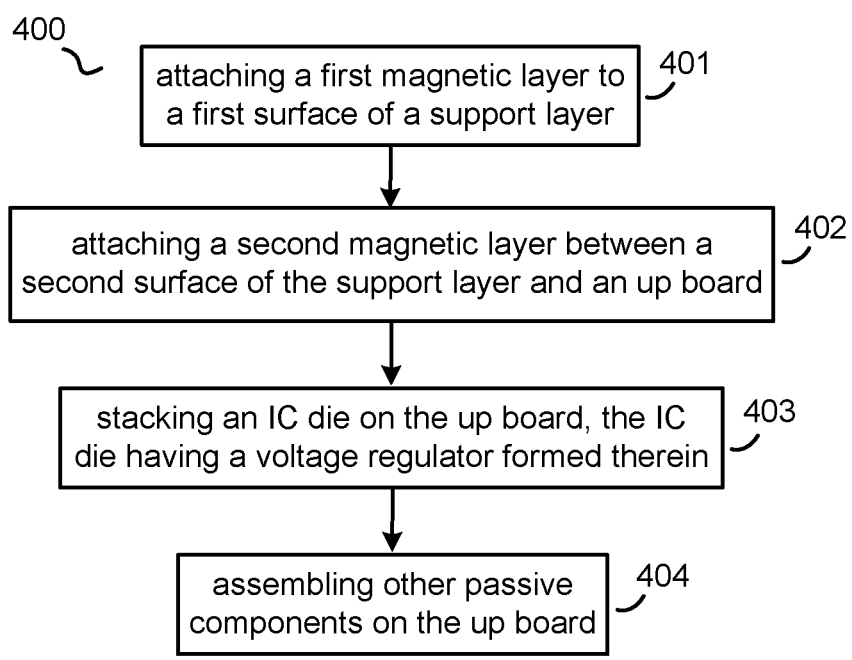
FIG. 4 schematically shows a flowchart 400 of a 3-D packaging method in accordance with an embodiment of the present invention.

FIG. 4 schematically shows a flowchart 400 of a 3-D packaging method in accordance with an embodiment of the present invention. The method comprising:

Step 401: attaching a first magnetic layer to a first surface of a support layer, the support layer containing metal traces.

Step 402: attaching a second magnetic layer between a second surface of the support layer and an up board, the up board being stacked above the support layer, and the first surface and the second surface of the support layer are opposite to each other.

Step 403, stacking an IC die on the up board, the IC die being configured to contain a voltage regulator. And Step 404: assembling other passive components on the up board.

In one embodiment of the present invention, the method further comprising: assembling the package on a lead frame.

In one embodiment of the present invention, the IC die comprises a flip chip, electrically coupled to the up board by way of contacts; and the support layer and the up board may be electrically coupled to the lead frame by way bonding wires.

In another embodiment of the present invention, the IC die may be electrically coupled to the up board, the support layer and the lead frame by way of bonding wires.

In one embodiment of the present invention, the support layer and the up board may respectively comprise a multilayer substrate, and the metal traces are embedded into the support layer.

Several embodiments of the foregoing 3-D package structure provide better transformer design. Unlike the conventional technology, several embodiments of the foregoing 3-D package structure have the metal traces be covered by magnetic films from both sides, thus an effective transformer is formed, which doubles the power throughput and attenuates the radiation emission from transformer windings. In addition, because IC die, the supported layer, the magnetic layers, and the up board are stacked in vertical direction, the size is significantly reduced.

It is to be understood in these letters patent that the meaning of "A" is coupled to "B" is that either A and B are connected to each other as described below, or that, although A and B may not be connected to each other as described above, there is nevertheless a device or circuit that is connected to both A and B. This device or circuit may include active or passive circuit elements, where the passive circuit elements may be distributed or lumped-parameter in nature. For example, A may be connected to a circuit element that in turn is connected to B.

This written description uses examples to disclose the invention, including the best mode, and also to enable a person skilled in the art to make and use the invention. The patentable scope of the invention may include other examples that occur to those skilled in the art.

What is claimed is:

1. A 3-D package structure, comprising:
a support layer, configured to contain metal traces;
a first magnetic layer, attached to a first surface of the support layer;
an up board, stacked on the support layer;
a second magnetic layer, attached between a second surface of the support layer and the up board, the first surface and the second surface of the support layer being opposite to each other; and
an IC die, stacked on the up board, the IC die being configured to contain a voltage regulator.

2. The 3-D package structure of claim 1, wherein:
the support layer comprises a substrate board; and
the metal traces are embedded in the substrate board.

3. The 3-D package structure of claim 1, wherein:
the IC die comprises a flip chip, electrically coupled to the up board by way of contacts.

4. The 3-D package structure of claim 1, wherein:
the package structure is assembled at a lead frame; and
the up board is electrically coupled to the support layer and the lead frame by way of bonding wires.

5. The 3-D package structure of claim 4, wherein:
the IC die is electrically coupled to the up board, the support layer and the lead frame by way of bonding wires.

6. The 3-D package structure of claim 1, wherein:
the up board comprises a multilayer substrate.

7. A 3-D package structure, comprising:
a support layer, configured to contain metal traces;
a first magnetic layer and a second magnetic layer, attached respectively on a first surface and a second surface of the support layer, the first surface and the second surface are opposite to each other; and
an IC die, assembled above the first magnetic layer, the IC die being configured to contain a voltage regulator.

8. The 3-D package structure of claim 7, wherein:
the support layer comprises a substrate board; and
the metal traces are embedded in the substrate board.

9. The 3-D package structure of claim 7, wherein:
the package structure is assembled at a lead frame; and
the support layer and the IC die are coupled to the lead frame by bonding wires.

10. The 3-D package structure of claim 7, wherein:
the first magnetic layer and the second magnetic layer are embedded into the support layer.

11. The 3-D package structure of claim 7, wherein:
the first magnetic layer and the second magnetic layer is respectively attached to the support layer by way of an adhesive layer.

12. A 3-D packaging method, comprising:
- attaching a first magnetic layer to a first surface of a support layer, the support layer containing metal traces;
- attaching a second magnetic layer between a second surface of the support layer and an up board, the up board being stacked above the support layer, and the first surface and the second surface of the support layer are opposite to each other;
- stacking an IC die on the up board, the IC die being configured to contain a voltage regulator; and
- assembling other passive components on the up board.

13. The 3-D packaging method of claim 12, wherein:
- the IC die comprises a flip chip, electrically coupled to the up board by way of contacts; and
- the support layer and the up board are electrically coupled to a lead frame by way bonding wires.

14. The 3-D packaging method of claim 12, wherein:
- the support layer and the up board respectively comprises a multilayer substrate, and the metal traces are embedded into the support layer.

15. The 3-D packaging method of claim 12, wherein:
- the IC die is electrically coupled to the up board, the support layer and a lead frame by way of bonding wires.

* * * * *